PULSE GENERATING CIRCUITS
Filed Jan. 21, 1963
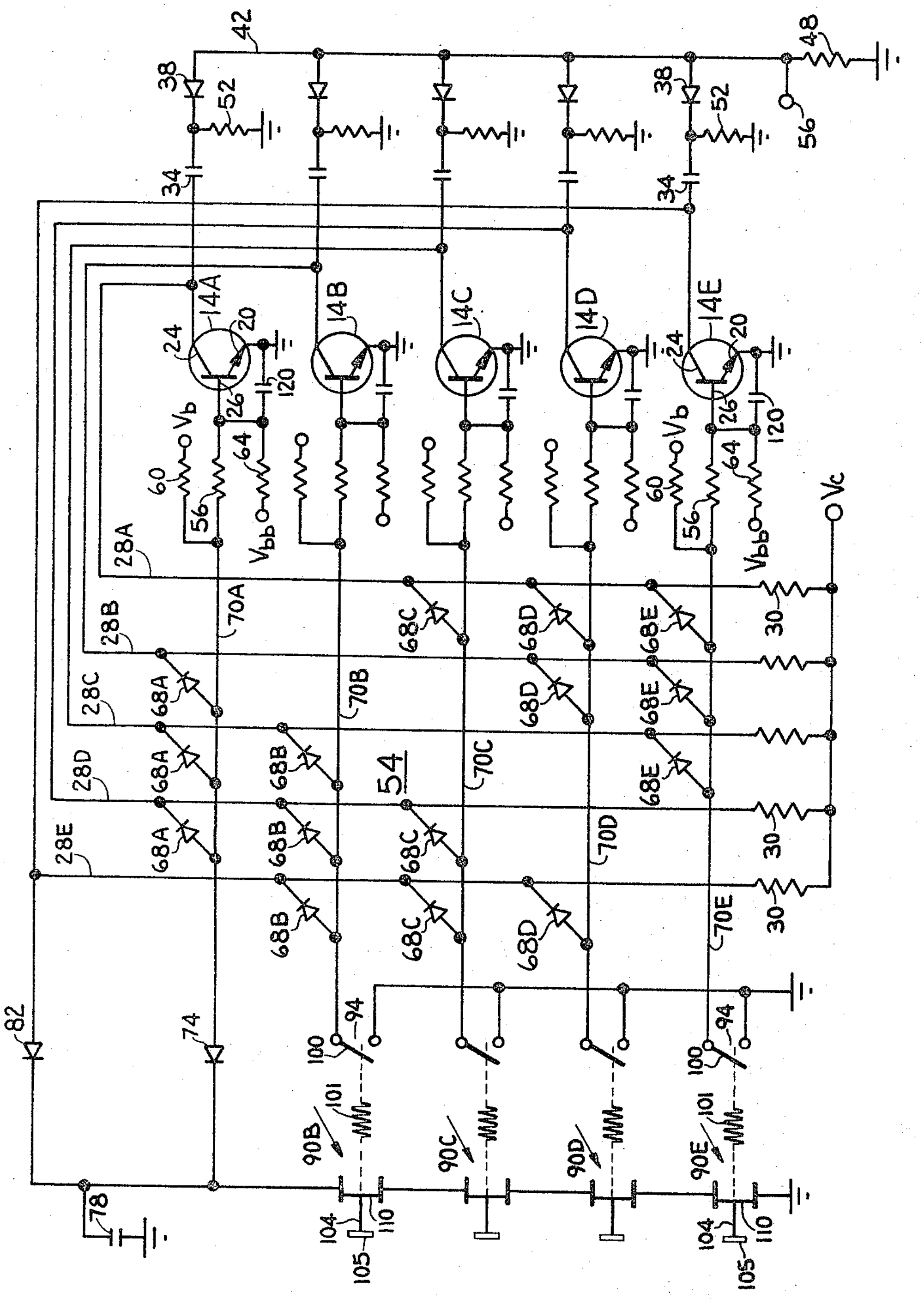
INVENTOR.
JAMES J. KLINIKOWSKI
BY
Robert A. Green
ATTORNEY United States Patent Office 3,307,174
Patented Feb. 28, 1967

3,307,174

PULSE GENERATING CIRCUITS

James J. Klinikowski, Somerville, N.J., assignor to Burroughs Corporation, Detroit, Mich., a corporation of Michigan Filed Jan. 21, 1963, Ser. No. 252,928
3 Claims. (Cl. 340—359)

This invention relates to pulse generating circuits and, particularly, to pulse generating circuits using semiconductor devices.

Semiconductor devices are now in wide use in all types of circuits. In recent years, the electronics industry has had under consideration the development of so-called integrated circuits which comprise groups of semiconductor devices and/or circuits made and packaged compactly and in units or modules.

Recently, Burroughs Corporation introduced a semiconductor package comprising a matrix of diodes which are compactly arranged, with the arrangement permitting relatively easy connection of leads to the diodes. Transistors and other components may also be included in these packages. It has now been found that this diode matrix provides a flexible nucleus for many interesting circuits such as counters, registers, or the like. The present invention comprises a pulse generating circuit which uses a diode matrix as a basic building block.

Briefly, apparatus embodying the invention includes a plurality of electron discharge devices, each of which comprises a pulse generator. The discharge devices are connected in series so that, in a cycle of operation, each is energized in turn, and, as each is energized, a pulse is produced. The input portions of each device are coupled to, and interrelated by, a diode matrix in such a way that the devices are free-running; that is, once the cycle is initiated, it continues automatically from one device to the next. In order to obtain selected numbers of pulses, means are provided both to select the number of pulses to be generated and to initiate the pulse generating cycle.

The drawing is a schematic representation of a pulse generating circuit embodying the invention.

Referring to the drawing, a pulse-generating circuit 10 embodying the invention includes a plurality of pulse-generating devices 14 (A, B, C . . . *n*), such as transistors or the like, connected in a series and adapted to generate a series of pulses in order from 14A to 14B, etc. Substantially any number of devices 14 may be provided in the pulse-generating series; for convenience, only five devices, 14A to 14E, are shown. In the drawing, the pulse-generating devices 14 are shown as NPN transistors; however, it is clear that other devices may also be used. Each transistor 14 includes an emitter electrode 20, a collector electrode 24, and a base electrode 26. Each emitter electrode 20 is connected to ground, and each collector electrode 24 is connected by a lead 28 (A, B, C, D, E) through a load resistor 30 to a positive D.C. power supply V*c*. Each collector 24 is also coupled through a capacitor 34 and diode 38, oriented as shown, to a bus 42 which is carried through a resistor 48 to ground. The cathode of each diode 38 is coupled through a resistor 52 to ground, and an output terminal 56 is provided on bus 42 at output resistor 48.

The base electrode 26 of each transistor 14 comprises the input electrode therefor and is connected into a diode matrix 54, by means of which the desired interaction of transistors 14 is achieved. Each base electrode is connected through a base resistor 56 and through a bias resistor 60 to a positive D.C. power source V*b*. Each base is also coupled through a resistor 64 to a small negative D.C. power source V*bb*. Each base is also coupled through a lead 70 (A, B, C, D, E) into the diode matrix 54.

Each collector electrode 24 of each transistor 14 is connected through its lead 28 and a diode 68 (A, B, C, D, E) to the base electrode of each transistor except its own transistor and except that of the next adjacent leading transistor in the counting cycle. The diodes 68 are oriented so that a cathode is connected to a collector electrode of a transistor and an anode is connected to a base electrode of a transistor. Thus, the collector electrode of transistor 14A is connected to the cathode of a diode 68C, the anode of which is connected to the base electrode of the transistor 14C. The collector of transistor 14A is similarly coupled by diodes 68D and 68E to the base electrodes of transistors 14D and 14E. The collector electrode of transistor 14B is coupled in similar fashion through diodes 68A, 68D, and 68E to all base electrodes except its own and that of adjacent leading transistor 14C. The other collector electrodes are similarly connected.

The base of transistor 14A is also connected through lead 70A to a diode 74, oriented as shown, and through a filter capacitor 78 to ground. The collector of transistor 14K is also coupled through its lead 28K to a diode 82, oriented as shown, and to the filter capacitor 78.

A push-button operated, double-acting switch 90 (B, C, D, E) is provided for each of the transistors 14B through 14E. Each switch includes a normally open portion 94 connected in series between the base leads 70 and ground. The switches include a contact member 100 for closing the associated open portion 94 and thus connecting the base electrode of each transistor 14 to ground. The contact members 100 are spring-coupled to, and operated by, a rod 104 which is operated by a push-button 105. The switch rods 104 carry second normally closed contact portions 110 which are connected in series between the cathodes of diodes 74 and 82 and ground. The switches 90 operate as follows. When a push button 105 on a switch 90 is manipulated, first the contact member 100 closes the normally open switch portion 94 and the base electrode of the associated transistor 14 is connected to ground. If the pressure on the push-button is maintained, the second contact portion 110 is opened and the cathodes of diodes 74 and 82 are disconnected from ground.

Of course, other switch means which accomplish the same functions as switches 90, may also be employed in practising the invention.

In operation of the circuit 10, initially all of the switch portions 110 are closed and the cathodes of the diodes 74 and 82 are connected to ground. Thus, leads 28E and 70A are at ground potential. The potential on lead 70A holds off transistor 14A, and the potential of lead 28E acting through diodes 68 B, C and D holds off transistors 14 B, C, and D. Thus, only the base electrode of transistor 14E is not connected to ground, and the potentials applied to it are such that this transistor is turned on. With transistor 14E turned on, its collector electrode is reduced to about ground potential, and this potential coupled through lead 28E and diodes 68 B, C, and D is applied to the base electrodes of transistors 14 B, C, and D.

When it is desired to generate a series of *n* pulses, for example four pulses, the push-button of switch 90E coupled to transistor 14E, the *n*+1 transistor in the series, is operated, the normally open switch contact 94 of this switch is closed, and the base electrode of transistor 14E is connected to ground, and this connection is maintained throughout this cycle of operation. Thus, this transistor 14E is immobilized. Continued operation of the switch 90E opens the contact portion 110 thereof, and the ground connection of the diodes 74 and 82 is removed. The base electrode of transistor 14A then rises to a positive potential and transistor 14A is turned on. When transistor 14A turns on, its collector electrode is grounded, and this ground potential is coupled through lead 28A and diodes 68C, D, and E to the base electrodes of transistors 14C, D, and E which are thus held off. Of course, transistor 14E is already held off by switch 90E. It can be seen that there is now no ground potential on the base electrode of transistor 14B so that transistor 14B, because of the other applied potentials, turns on. The resultant ground potential of the collector electrode of transistor 14B coupled through lead 28B and diodes 68A, D, and E holds off transistors 14A, D, and E. Now, there is no ground potential on the base electrode of transistor 14C, and this transistor turns on. Transistor 14C holds off transistors 14A, B, and E. However, transistor 14D is now free to turn on as described above. Transistor 14D holds off transistors 14A, B, and C. The cycle of operation is stopped at this point because transistor 14E is grounded through the switch 90E. In the foregoing cycle of operation, as each transistor 14A, B, C, and D is turned on, it generates an output pulse on bus 42 and at terminal 56. Thus, the desired four pulses are produced automatically and at relatively high speed by the manipulation of a single switch means.

If it is desired to produce any other number of pulses, the appropriate switch 90 is manipulated, and the desired number of pulses is automatically provided.

Under some circumstances, the speed of operation of the pulse-generating circuit 10 may be considered too high for convenient utilization. In this case, the speed may be reduced by connecting the base electrode 26 of each transistor 14 through a capacitor 120 to ground. Such a capacitor has the effect of reducing the speed of response of the transistor to which it is connected.

What is claimed is:

1. A pulse generating circuit comprising
a plurality of pulse-generating devices connected in a series for generating a series of pulses,
each device having an input circuit and an output circuit,
circuit means associated with the input and output circuits of said devices coupling the output of each device through a diode to the input of every other device except the one adjacent to and leading it in the series so that, as each device is turned on, it holds off all other devices except said adjacent leading device,
first circuit means coupled to the inputs of all of said devices except the last device in the series for holding normally-off all of the devices, except the last device which is normally-on before the initiation of a pulse-generating cycle, said first circuit means being operable to cause the first device in the series to turn on and initiate a pulse-generating cycle, and
second circuit means coupled to the input of each device for selecting a device and disabling it so that it cannot generate a pulse in a cycle whereby a pulse-generating cycle is ended when the cycle reaches said one selected device.

2. A pulse-generating circuit comprising
a plurality of pulse-generating devices connected in a series for generating a series of pulses,
each device having an input circuit and an output circuit,
the output circuit of each device being coupled through a diode to the input circuit of every other device except the one adjacent to it in the series,
a series of first switches, one for each device, coupled from a source of hold-off potential through diode means to the input of every device except the last in the series so that with all of said first switches closed, hold-off potential is applied to all devices except said last device which is thus permitted to turn on,
the connection of the output of said last device through diodes to the input of all other devices except the first in the series providing auxiliary hold-off potential, in addition to the operation of said series of first switches, to hold off all other devices except the first so that the opening of any of said first switches removes hold-off potential from the first device and it is permitted to turn on,
a second switch in the input circuit of each device for connecting the input of each device directly to a source of hold-off potential,
each first switch being coupled to and adapted to operate one second switch, with the order of operation being first a second switch and then the associated first switch,
the closing of the second switch associated with a selected device rendering said selected device unable to turn on and thus setting said selected device as the end point of a pulse-generating cycle, and the opening of the associated first switch permitting said first device to turn on to start the pulse-generating cycle at the first device in the series and proceeding through the following devices in the series up to said selected device.

3. A pulse-generating circuit comprising
a plurality of pulse-generating devices connected in a series for generating a series of pulses,
each device having an input circuit and an output circuit,
the output circuit of each device being coupled through a diode to the input circuit of every other device except the one adjacent to it in the series,
a series of first switches, one for each device, connected in series from ground and through diode means to the input of every device except the last in the series so that with all of said first switches closed, hold-off potential is applied to all devices except the last device which is on,
the connection of the output of said last device through diodes to the input of all other devices except the first in the series providing auxiliary hold-off potential, in addition to the operation of said series of first switches, to hold off all other devices except the first so that the opening of any of said first switches removes hold-off potential from the first device and it turns on,
a second switch in the input circuit of each device for connecting the input of each device directly to ground whereby it is held off,
each first switch being coupled to and adapted to operate one second switch, with the order of operation being first a second switch and then the associated first switch,
the closing of the second switch associated with a selected device setting the end point of a pulse-generating cycle, and the opening of the associated first switch starting the pulse-generating cycle at the first device in the series and proceeding through the following devices in the series up to said selected device.

References Cited by the Examiner

UNITED STATES PATENTS

| | | | |
|---|---|---|---|
| 2,975,410 | 3/1961 | Groce et al. | 340—359 |
| 3,011,159 | 11/1961 | Glaser et al. | 340—168 |
| 3,041,476 | 6/1962 | Parker | 340—168 |
| 3,152,320 | 10/1964 | Domenico et al. | 340—166 |

OTHER REFERENCES

Brown and Rochester, "Rectifier Networks for Multipurpose Switching," Proceedings of the I.R.E., February 1949, pp. 139–147.

NEIL C. READ, *Primary Examiner.*

A. J. KASPER, *Assistant Examiner.*